US012794497B2

(12) United States Patent
Allebes et al.

(10) Patent No.: US 12,794,497 B2
(45) Date of Patent: Nov. 10, 2026

(54) RADIO FREQUENCY DIGITAL-TO-ANALOG CONVERTER

(71) Applicant: Stichting IMEC Nederland, Eindhoven (NL)

(72) Inventors: Erwin Allebes, Sterksel (NL); Johan Van Den Heuvel, Geldrop (NL)

(73) Assignee: STICHTING IMEC NEDERLAND, Eindhoven (NL)

( * ) Notice: Subject to any disclaimer, the term of this patent is extended or adjusted under 35 U.S.C. 154(b) by 145 days.

(21) Appl. No.: 18/983,780

(22) Filed: Dec. 17, 2024

(65) Prior Publication Data

US 2025/0211264 A1 Jun. 26, 2025

(30) Foreign Application Priority Data

Dec. 21, 2023 (EP) .................................... 23219091

(51) Int. Cl.
*H04B 1/04* (2006.01)
*H03M 1/10* (2006.01)

(52) U.S. Cl.
CPC ............ *H04B 1/04* (2013.01); *H03M 1/1014* (2013.01)

(58) Field of Classification Search
CPC ............................... H04B 1/04; H03M 1/1014
See application file for complete search history.

(56) References Cited

U.S. PATENT DOCUMENTS 5,986,589 A * 11/1999 Rosefield ......... G11B 20/10527 341/61
9,825,643 B1 11/2017 Taylor et al.
2020/0329449 A1* 10/2020 Chowdhury .............. G01S 5/02
(Continued)

OTHER PUBLICATIONS

Allebes, et al., "21.2 A 3-to-10GHz 180pJ/b IEEE802.15.4z/4a IR-UWB Coherent Polar Transmitter in 28nm CMOS with Asynchronous Amplitude Pulse-Shaping and Injection-Locked Phase Modulation," 2021 IEEE International Solid-State Circuits Conference (ISSCC), 2021, pp. 304-306.
(Continued)

*Primary Examiner* — Raymond S Dean
(74) *Attorney, Agent, or Firm* — MOSER TABOADA

(57) ABSTRACT

A radio frequency digital-to-analog converter comprising: a first stage converter, driven by a clock signal having a frequency $F_{BB}$, configured to receive a digital baseband signal and to generate a number N parallel data streams, each having a first resolution; a serializer, driven by a clock signal having a frequency $F_s$, configured to convert the number N parallel data streams into a serial data stream; and a second stage converter, configured to generate an analog up-converted RF signal based on the serial data stream, wherein the analog up-converted RF signal has a second resolution. The second stage converter comprises a number K slices in parallel, configured to each generate a respective portion of the analog up-converted RF signal, such that the second resolution matches the first resolution. Each slice of the number K slices comprises at least one analog delay element. $F_{BB}=F_s/N$; N is an integer, N>=1; K is an integer, K>=2.

15 Claims, 3 Drawing Sheets

(56) References Cited

U.S. PATENT DOCUMENTS

| | | | | |
|---|---|---|---|---|
| 2021/0067182 | A1* | 3/2021 | Ravi | G01R 27/06 |
| 2021/0226642 | A1* | 7/2021 | Booth | H03L 7/24 |
| 2021/0391853 | A1* | 12/2021 | Jann | H03B 5/12 |
| 2022/0294465 | A1* | 9/2022 | De Andrade Tabarani Santos | H03F 3/20 |
| 2023/0198562 | A1 | 6/2023 | Poon et al. | |

OTHER PUBLICATIONS

Bhat, et al., "Wideband Mixed-Domain Multi-Tap Finite-Impulse Response Filtering of Out-of-Band Noise Floor in Watt-Class Digital Transmitters", IEEE Journal of Solid-State Circuits, vol. 52, No. 12, Dec. 2017, pp. 3405-3420.

Bhat, et al., "A >1W 2.2GHz Switched-Capacitor Digital Power Amplifier with Wideband Mixed-Domain Multi-Tap FIR Filtering of OOB Noise Floor", ISSCC 2017 / SESSION 13 / High-Performance Transmitters / 13.10, 3 pages.

Zhou, et al., "A 10-Bit, 100-MHz CMOS Linear Interpolation DAC", ESSCIRC 2002, pp. 471-474.

Zhou, et al., "A 10-Bit Wide-Band CMOS Direct Digital RF Amplitude Modulator", IEEE Journal of Solid-State Circuits, vol. 38, No. 7, Jul. 2003, pp. 1182-1188.

Zhang, et al., "An Active-Under-Coil RFDAC With Analog Linear Interpolation in 28-nm CMOS", IEEE Transactions on Circuits and Systems-I: Regular Papers, vol. 68, No. 5, May 2021, pp. 1855-1868.

Filho, et al., "An Incremental-Charge-Based Digital Transmitter With Built-in Filtering", IEEE Journal of Solid-State Circuits, vol. 50, No. 12, Dec. 2015, pp. 3065-3076.

Olieman, et al., "A worldwide-compliant 802.15.4/4z IR-UWB RFDAC transmitter in 28nm CMOS with 12dBm peak output power", 2023 IEEE, pp. 61-64.

Rahmatollahi, et al., "A Simple Pre-filtering for Spectral Smoothing in a Radio Frequency Digital to Analog Converter", 2012 IEEE, pp. 103-106.

Chen, et al., "A 6.5-to-10GHz IEEE 802.15.4/4z-Compliant 1T3R UWB Transceiver", ISSCC 2022 / Session 24 / Low-Power and UWB Radios for Communication and Ranging / 24.3, 3 pages.

Ba, et al., "A 0.62nJ/b multi-standard WiFi/BLE wideband digital polar TX with dynamic FM correction and AM alias suppression for IoT applications", 2018 IEEE Radio Frequency Integrated Circuits Symposium, pp. 308-311.

Filho, et al., "A 0.22mm2 CMOS Resistive Charge-Based Direct-Launch Digital Transmitter with—159dBc/Hz Out-of-Band Noise", ISSCC 2016 / Session 13 / Wireless Systems / 13.7, 3 pages.

Pisati, et al., "A 243-mW 1.25-56-GB/s Continuous Range PAM-4 42.5-dB IL ADC/DAC-Based ransceiver in 7-nm FinFET", IEEE Journal of Solid-State Circuits, IEEE, USA, vol. 55, No. 1, Jan. 1, 2020 (Jan. 1, 2020), pp. 6-18.

Gruber, et al., "A 12-b 16-GS/s 1-15 RF-Sampling Capacitive DAC for Multi-Band Soft Radio Base-Station Applications With On-Chip Transmission-Line Matching Network in 16-nm FinFET", IEEE Journal of Solid-State Circuits, IEEE, USA, vol. 56, No. 12, Sep. 14, 2021 (Sep. 14, 2021), pp. 3655-3667.

Extended European Search Report for Application No. 23219091.8 dated Jun. 14, 2024, 7 pages.

* cited by examiner

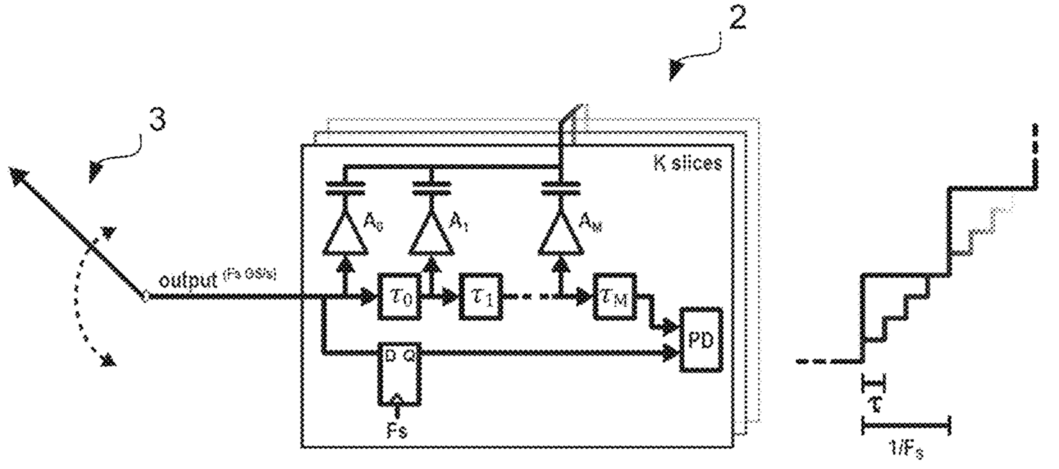
Fig. 5
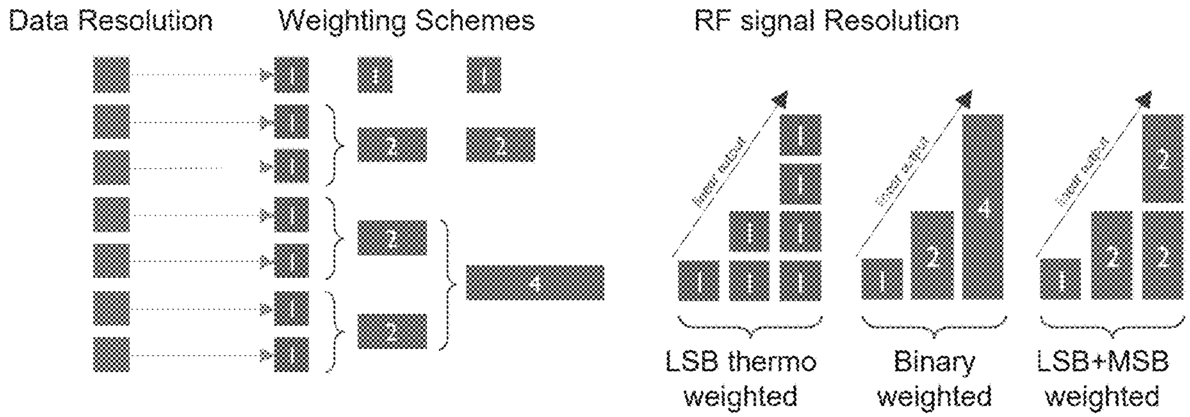
Fig. 6A
Fig. 6B

RADIO FREQUENCY DIGITAL-TO-ANALOG CONVERTER

CROSS-REFERENCE TO RELATED APPLICATION

The present application claims the benefit of and priority to EP Patent Application Serial No. 23219091.8, filed Dec. 21, 2023, the entire contents of which is incorporated herein by reference.

TECHNICAL FIELD

The present description relates to the conversion of digital data to analog RF signals, and in particular to a radio frequency digital-to-analog converter (RFDAC) and a method of digital to analog RF signal conversion.

BACKGROUND

Wireless communications based on RF waves over both short and long distances have become more and more important to enable services, such as Wi-Fi and mobile communication. RFDACs for converting digital data into analog RF signals are widely utilized in wireless communication systems, for enabling transmission and reception of RF waves.

The regulatory bodies have different requirements to specify requirements, e.g., the maximum power or frequency range within which the device's emissions must remain, to ensure compliance with safety and interference regulations. One of the requirements of the regulatory bodies is the regulatory spectral mask. Thus, compliance with these requirements is crucial. However, the transmitters often face challenges in meeting these requirements due to inherent limitations in existing designs. For example, the stringent spectral requirement of the regulatory bodies for electronic devices, e.g., Ultra-Wideband (UWB) electronic devices may imply a steep RF filtering.

One current trend of the transmitter design is to use digital transmitters, e.g., digital polar transmitters, for advantages such as scalability, low power, less components, ease of calibration, and suitable for mass production. For example, the signal bandwidth is 499.2 MHz for UWB. To achieve the required spectral mask purity, a digital sample rate of 40 Gsps (Giga sample per second) is required. However, such a high digital sample rate is not only costly in terms of power and area, but also impractical in the current Complementary Metal Oxide Semiconductor (CMOS) technology.

One solution is to use a lower digital sample rate, such as 4 Gsps. However, it would typically cause huge spectral copies violating the regulatory spectral masks, make such solutions inappropriate or even useless.

Another solution is to use asynchronous design to achieve the required spectral purity. However, such designs are known to be complicated and time-consuming to calibrate and to manufacture in mass production.

Hence, there is a need for an RFDAC and a transmitter/transceiver for not only an improved regulatory spectral mask compliance, but also a lower power consumption, a reduced area and complexity, and a simplified calibration and mass production.

SUMMARY

An objective of the present description is to provide an improved RFDAC, an improved transmitter/transceiver comprising the RFDAC, and an improved digital-to-analog converting method.

To be specific, an objective of the present description is to provide a RFDAC for converting a digital baseband signal into an analog RF signal for transmitting by an antenna, having not only an improved spectral performance, but also a lower power consumption, a reduced area and complexity, and a simplified calibration and mass production.

According to a first aspect, there is provided a radio frequency digital-to-analog converter, RFDAC, comprising:

- a first stage converter, configured to receive a digital baseband signal and to generate a number N parallel data streams, each having a first resolution;
- a serializer, configured to convert the number N parallel data streams into a serial data stream; and
- a second stage converter, configured to receive the serial data stream, and to generate an analog up-converted radio frequency, RF, signal based on the serial data stream, wherein the analog up-converted RF signal has a second resolution;
- wherein the first stage converter is a digital Finite Impulse Response, FIR, filter;
- wherein the first stage converter is configured to be driven by a first clock signal having a first frequency $F_{BB}$;
- wherein the serializer is configured to be driven by a second clock signal having a second frequency $F_s$;
- wherein the second stage converter comprises a number K slices in parallel, at least some of the number K slices are configured to each generate a respective portion of the analog up-converted RF signal based on a unique part of the serial data stream, such that the second resolution matches the first resolution;
- wherein each slice of the number K slices comprises at least one analog delay element for shaping the respective portion of the analog up-converted RF signal;
- wherein $F_{BB}=F_s/N$;
- wherein N is an integer, and N>=1; and
- wherein K is an integer, and K>=2, preferably K>=4.

The first frequency $F_{BB}$ may represent a baseband speed or a symbol clock speed. The second frequency Fs may represent a higher data speed such that the number N parallel data streams of the first frequency $F_{BB}$ can be serialised to a serial data stream of the higher frequency $F_s$ ($F_s=N\times F_{BB}$).

The serializer may comprise a switch configured to: 1) operatively connect to each of the number N parallel data streams, one at a time, sequentially from a first until a last data stream of the number N parallel data streams, to receive data from the number N parallel streams of data sequentially; 2) after connected to the last stream of data, loop back to connect to the first data stream again; and 3) repeat 1) and 2), to convert the number N parallel data streams of a lower speed into a serial data stream of a higher speed.

The serializer may be configured to convert the number N parallel streams of data into one serial data stream.

The serializer may comprise a multiplexer.

The first stage converter and the serializer may be implemented as a single module.

When N=1, since there is a single data stream feed into the serializer, the output and input of the serializer may be the same.

The second stage converter may be configured to be driven by the second clock signal having the second frequency $F_s$, or a different clock signal having the second frequency $F_s$.

The second stage converter may be configured to generate the analog up-converted RF signal by mixing with an RF carrier.

The analog up-converted RF signal may be up-converted by a mixer mixing with an RF carrier. Thus, the output signal of the second stage converter is not an I/Q signal for transmitting by a I/Q transmitter.

A slice of a converter may refer to a portion or subsection of the converter, which may perform a part of the overall functionality of the converter, and collectively contribute to the conversion process.

Each slice may convert a part of the serial data stream into a part of the analog up-converted RF. The outputs of the number K slices may be summed or combined to form the analog up-converted RF signal.

Each slice may comprise multiple different components, such as delay elements, amplifiers, mixers, etc. These components work together to convert a digital input into an analog up-converted RF output.

Having multiple slices may allow for parallel conversion, which can increase the overall conversion speed and performance. The number K slices can be connected or configured in various ways depending on the specific design and requirements of the RFDAC.

N may be equal or larger than 2. That is, the first stage converter may generate at least two parallel data streams.

The first stage converter may comprise a number N modules in parallel, each configured to generate a respective one of the number N parallel data streams.

The number N parallel data streams may comprise data encoded by binary or thermometric coding.

The second resolution may be equal to or different from the first resolution.

The term "resolution" is used to define the level of detail of, e.g., an image or a signal. The higher the resolution, the more details are present, resulting in more detailed images or signals. In the present application, the term "resolution" is used to define the level of detail of a signal.

The first resolution may be characterized by the number of bits of data of the number N parallel data streams. For example, when the data is 5-bits, the first resolution of the parallel data stream may be 32 ($2^5$).

The second resolution may be characterized by the number K, i.e. the number of slices, i.e. the number of portions for forming the analog up-converted RF signal. For example, when K is selected to be 32 and all 32 slices together generate the analog up-converted RF signal, the analog up-converted RF signal has 32 portions, e.g., 32 amplitude steps. Thus, it is considered that the second resolution (the 32 portions) matches the first resolution (5-bits).

Each slice of the number K slices may have a respective weighting value for scaling a respective amplitude step of the respective portion of the analog up-converted RF signal.

The weighting values may be LSB (Least Significant Bit) thermos weighted, binary weighted, or LSB+MSB (Most Significant Bit) weighted (row-column), etc. Different weighting method would not change the second resolution.

Each slice of the at least some of the number K slices may be configured to generate the respective portion of the analog up-converted RF signal having a respective amplitude step. The analog up-converted RF signal may be formed by combining the outputs of the at least some of the number K slices.

The amplitude step of the respective portion of the analog up-converted RF signal may be a maximum amplitude difference of said portion of the analog up-converted RF signal.

The amplitude step may be one least significant bit, LSB, step of the up-converted RF analog signal.

The at least one analog delay element of the slice may provide an interpolation within the amplitude range of the amplitude step. In other words, instead of having only the number K of amplitude steps, the analog delay elements further refine the shape of the up-converted RF analog signal by interpolation. This may further improve spectral performance.

The at least one analog delay element may be tunable or programmable.

A tunable analog delay element may be an analog device or circuit that introduces a controllable delay to an input signal by utilizing analog components. Since it allows an adjustable delay time, it is widely used in radar systems, telecommunication systems, and various electronic applications where precise control over signal delays is essential.

A programmable analog delay element may be a more advanced version of the tunable delay element. It offers additional features and capabilities by allowing a user to program the delay time, e.g., remotely or through a control interface. The programmable analog delay element typically comprises a microcontroller to enable as precise and convenient control over delay settings.

This is advantageous as an accurate, dynamic, and flexible control over the delay parameters can be achieved.

Any two slices of the number K slices may have a same number or different numbers of analog delay elements.

The numbers of delay elements of the number K slices may be different from each other. This is advantageous as the spectral copies may be spread around.

Any two analog delay elements of each slice may be same or different.

Randomly changing a selected slice from slices with a different set of analog delay parameters for the analog delay elements may further improve the spectral performance and improve the performance in view of process, voltage and temperature variations.

Any of the K slices that have a different number of analog delay cells and/or any of the K slices that have different analog delay elements may be randomly selected during operation.

Randomly changing a selected slice from slices with a different number of analog delay elements may further improve the spectral performance and improve the performance in view of process, voltage and temperature variations.

Each analog delay element of the number K slices may have a respective weighting value for an amplitude scaling.

By providing a weighting value for each analog delay element, the RFDAC can be more flexible. This is also advantageous for shaping the analog signal.

Each slice of the number K slices may comprise a delay locked loop comprising the at least one analog delay element. The delay locked loop may be configured to synchronize said slice to the second clock signal.

The slice may be calibrated to synchronize with both the rising edge and the falling edge of said signal.

Each slice may comprise any of:

a switched-capacitor digital-to-analog converter, sc-DAC, a switched-capacitor amplifier, and a Zero Order Hold, ZOH, analog FIR filter.

The slice may be implemented by a combination of a digital-to-analog converter (DAC) and a power amplifier (PA).

According to a second aspect, there is provided a radio frequency transmitter or transceiver, comprising an RFDAC according to the first aspect, configured to receive the digital baseband signal and to generate the analog up-converted RF signal for transmitting.

According to a third aspect, there is provided a digital-to-analog converting method, comprising:

receiving a digital baseband signal and generating a number N parallel data streams each having a first resolution, by a first stage converter;

converting the number N parallel data streams into a serial data stream, by a serializer; and receiving the serial data stream, and generating an analog up-converted RF signal based on the serial data stream, by a second stage converter, wherein the analog up-converted RF signal has a second resolution;

wherein the first stage converter is a digital Finite Impulse Response, FIR, filter;

wherein the first stage converter is configured to be driven by a first clock signal having a first frequency $F_{BB}$;

wherein the serializer is configured to be driven by a second clock signal having a second frequency $F_s$;

wherein the second stage converter comprises a number K slices in parallel, the method comprising:

at least some of the number K slices each generating a respective portion of the analog up-converted RF signal based on a unique part of the serial data stream, such that the second resolution matches the first resolution;

wherein each slice of the number K slices comprises at least one analog delay element, the method comprising:

the at least one analog delay element shaping the respective portion of the analog up-converted RF signal;

wherein $F_{BB}=F_s/N$;

wherein N is an integer, and N>=1; and wherein K is an integer, and K>=2, preferably K>=4.

The second and third aspects may generally present the same or corresponding advantages as the first aspect.

BRIEF DESCRIPTION OF THE DRAWINGS

The above, as well as additional objects, features, and advantages of the present description, will be better understood through the following illustrative and non-limiting detailed description, with reference to the appended drawings. In the drawings like reference numerals will be used for like elements unless stated otherwise.

FIG. 5 is a schematical view of an example second stage converter.

FIGS. 6A-6B illustrate different weighting schemes for slices of a second stage converter.

DETAILED DESCRIPTION

In connection with FIG. 1, an example RFDAC will be discussed in detail.

The RFDAC comprises a first stage converter 1, a second stage converter 2, and a serializer 3 connecting to the first and second stage converter 1, 2.

An RF transmitter or transceiver may comprise the RFDAC for receiving a digital baseband signal and to generate an analog up-converted RF signal for transmitting by an antenna.

The first stage converter 1 is a digital Finite Impulse Response, FIR, filter. The first stage converter 1 is configured to receive a digital baseband signal as an input signal, and to generate a number N parallel data streams, each having a first resolution. N is an integer, and N>=1.

The first stage converter 1 is configured to be driven by a first clock signal having a first frequency $F_{BB}$.

The first stage converter 1 is a digital Finite Impulse Response, FIR, filter.

Since the conversion performed by the first stage converter 1 is digital, which is fully configurable, the spectral performance of the RFDAC can be improved, and the inter-symbol interference (ISI) can be suppressed.

The serializer 3 is configured to receive and convert the number N parallel data streams into a serial data stream.

Figure 1:
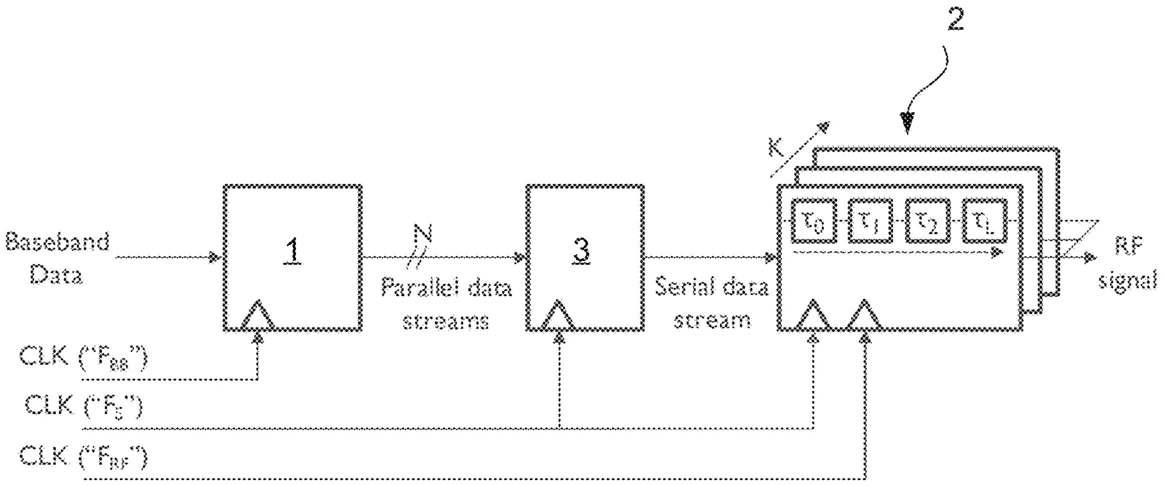
FIG. 1 is a schematical view of an example RFDAC.

As shown in FIG. 1, the serializer 3 may be configured to convert the number N parallel streams of data into one serial data stream.

The serializer 3 may comprise a multiplexer or a switch.

The serializer 3 is configured to be driven by a second clock signal having a second frequency $F_s$, wherein $F_{BB}=F_s/N$.

By using the serializer 3, multiple parallel slow sample rate data streams can be combined into one or more high speed data streams.

The first stage converter 1 and the serializer 3 may be implemented as a single module, driven by the first clock signal.

When N=1, since there is a single data stream feed into the serializer 3, the output and input of the serializer 3 may be the same.

The number N parallel data streams may comprise data encoded by binary or thermometric coding.

The second stage converter 2 is configured to receive the serial data stream, and to generate an analog up-converted radio frequency, RF, signal based on the serial data stream. The analog up-converted RF signal has a second resolution.

The second stage converter 2 comprises a number K slices in parallel, at least some of the number K slices are configured to each generate a respective portion of the analog up-converted RF signal based on a unique part of the serial data stream, such that the second resolution matches the first resolution.

Each slice of the number K slices comprises at least one analog delay element for shaping the respective portion of the analog up-converted RF signal. K is an integer, and K>=2, preferably K>=4.

A slice of a converter may refer to a portion or subsection of the converter, which may perform a part of the overall functionality of the converter, and collectively contribute to the conversion process.

Each slice may convert a part of the serial data stream into a part of the analog up-converted RF. The outputs of the number K slices may be summed or combined to form the analog up-converted RF signal.

Thus, the slices may be considered to contribute to the resolution of the analog up-converted RF signal. The higher the number of the slices for forming the analog up-converted RF signal, the higher the resolution of the analog up-converted RF signal.

Each slice may comprise multiple different components, such as one or more analog delay elements, amplifiers, mixers, etc. These components work together to convert a digital input into an analog up-converted RF output.

Having multiple slices may also allow for parallel conversion, which can increase the overall conversion speed and performance. The number K slices can be connected or configured in various ways depending on the specific design and requirements of the RFDAC.

The second stage converter 2 may be configured to be driven by the second clock signal having the second frequency $F_s$, or a different clock signal having the second frequency $F_s$.

The second stage converter may be configured to generate the analog up-converted RF signal by mixing with an RF carrier. The analog up-converted RF signal may be up-converted by a mixer (not shown) mixing with an RF carrier. Thus, the output signal of the second stage converter 2 is not an I/Q signal for transmitting by a I/Q transmitter.

As shown in FIG. 1, the second stage converter 2 may receive a RF clock signal having a frequency $F_{RF}$.

The at least one analog delay element may be tunable or programmable.

A tunable analog delay element may be an analog device or circuit that introduces a controllable delay to an input signal by utilizing analog components. Since it allows an adjustable delay time, it is widely used in radar systems, telecommunication systems, and various electronic applications where precise control over signal delays is essential.

A programmable analog delay element may be a more advanced version of the tunable delay element. It can offer additional features and capabilities by allowing a user to program the delay time, e.g., remotely or through a control interface. The programmable analog delay element typically comprises a microcontroller to enable a precise and convenient control over the delay settings.

This is advantageous as an accurate, dynamic, and flexible control over the delay parameters can be achieved.

The second resolution may be equal to or different from the first resolution.

The term "resolution" is used to define the level of detail, e.g., of an image or of a signal. The higher the resolution, the more details are present, resulting in more detailed images or signals. In the present application, the term "resolution" is used to define the level of detail of a signal.

The first resolution may be characterized by the number of bits of data of the number N parallel data streams. For example, when the data is 5-bits, the first resolution of the parallel data stream may be 32 ($2^5$). The resolution of the serial data stream may be different from the first resolution of the parallel data stream, as the serializer may skip one or more bits of the data of the parallel data streams.

The second resolution may be characterized by the number K, i.e. the number of slices, i.e. the number of portions for forming the analog up-converted RF signal.

For example, when K is selected to be 32 and all 32 slices respectively generate 32 portions for forming the analog up-converted RF signal, the analog up-converted RF signal has 32 amplitude steps (both amplitude increasing steps and decreasing steps). Thus, it is considered that the second resolution (the 32 portions) of the analog up-converted RF signal matches the first resolution (5-bits).

However, the first and second resolution do not need to be equal. For example, when the serializer 3 skips one bit of the parallel data streams (e.g., 5-bits), the serial data stream input to the second stage converter 2 is of e.g., 4-bits (5−1). Even if K is 32 and only 16 of the 32 slices are used to respectively generate 16 portions for forming the analog up-converted RF signa, it is still considered that the second resolution (the 16 amplitude steps) matches the first resolution (5-bits).

In other words, the number K is selected such that the resolution of the output analog up-converted RF signal matches the resolution of the input parallel data streams in a way that no information or very little amount of information is lost during the digital-to-analog conversion.

In FIG. 1, one example slice comprises a number L analog delay elements. L is an integer, and L>=1.

The pulse shape of the analog up-converted RF signal to be transmitted is important for its spectral performance. As any discontinuity of the pulse shape of a signal in the time domain would introduce unwanted noises in the frequency domain.

The analog delay elements of the slices may refine the pulse shape of the analog up-converted RF signal for improving spectral performance.

The analog delay elements may refine the pulse shape of the analog up-converted RF signal by interpolation. Interpolation may refer to a method of creating new data points based on a set of known data points to refine or smoothen a curve based on the set of known data points. One goal of interpolation is to create intermediate values between provided values. Examples of interpolation may include linear interpolation, polynomial interpolation, etc.

The present description also includes a digital-to-analog converting method. The digital-to-analog converting method can be implemented by the RFDAC of the present description.

The digital-to-analog converting method comprises:

receiving a digital baseband signal and generating a number N parallel data streams each having a first resolution, by a first stage converter 1;

converting the number N parallel data streams into a serial data stream, by a serializer 3; and receiving the serial data stream, and generating an analog up-converted RF signal based on the serial data stream, by a second stage converter 2, wherein the analog up-converted RF signal has a second resolution;

wherein the first stage converter 1 is a digital Finite Impulse Response, FIR, filter;

wherein the first stage converter 1 is configured to be driven by a first clock signal having a first frequency $F_{BB}$;

wherein the serializer 3 is configured to be driven by a second clock signal having a second frequency $F_s$;

wherein the second stage converter 2 comprises a number K slices in parallel, the method comprising:

at least some of the number K slices each generating a respective portion of the analog up-converted RF signal based on a unique part of the serial data stream, such that the second resolution matches the first resolution;

wherein each slice of the number K slices comprises at least one analog delay element, the method comprising:

the at least one analog delay element shaping the respective portion of the analog up-converted RF signal;

wherein $F_{BB}=F_s/N$; N is an integer, and N>=1; and K is an integer, and K>=2, preferably K>=4.

In connection with FIGS. 2A-2B, the first stage converter will be discussed in detail.

Figure 2A:
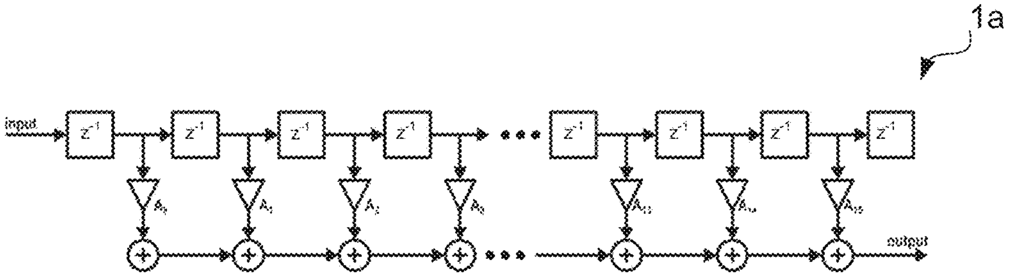
FIGS. 2A-2B are two examples of a first stage converter.

FIG. 2A illustrates an example first stage converter **1*a*** when N=1.

The first stage converter **1*a*** is a digital Finite Impulse Response, FIR, filter, configured to receive a digital baseband signal as input and to generate one data stream having a first resolution as output.

A digital FIR filter is a type of digital filter used to process digital signals. It is called "Finite Impulse Response" because the filter's response to an impulse input is finite in duration. An FIR filter operates by convolving the input signal with a finite and usually symmetric sequence of filter coefficients, often called the impulse response. These coefficients determine the overall frequency response of the FIR filter.

Using a digital FIR filter is advantageous as it can be easily designed to provide a clean output signal without introducing any distortion in the time domain, and to offer a better control over the frequency response characteristics.

In typical implementation, N>=2. FIG. 2B illustrates an example first stage converter 1*b* when N>=2.

Figure 2B:
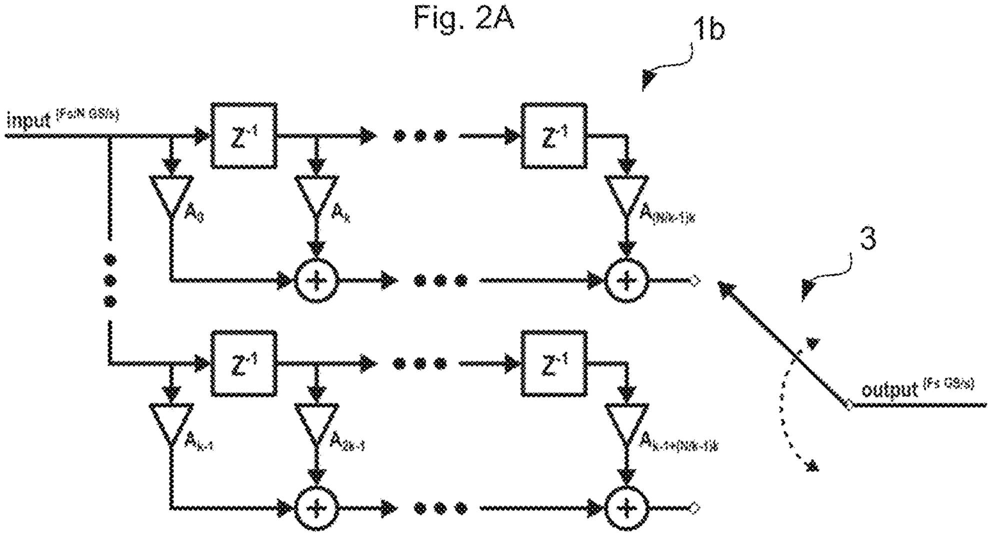

As shown in FIG. 2B, the first stage converter 1*b* may comprise a number N modules in parallel, each configured to receive the same digital baseband signal, and to generate a respective one of the number N parallel data streams.

The serializer 3 in FIG. 2B is illustrated as a switch.

The switch may be configured to operatively connect to one of the number N parallel data streams at a time, from a first until a last data stream of the number N parallel data streams, to sequentially receive data from the number N parallel data streams. After connected to the last data stream, the switch may loop back to connect to the first data stream, and operatively connect from the first until the last data stream again, to sequentially receive data from the number N parallel data streams. Thus, the switch may perform the parallel to serial conversion by repeatedly sweeping over the number N parallel data streams.

In FIG. 2B, the number k refers to a depth of the digital FIR filter, which is different the number K representing the number of slices of the second stage converter 2.

FIGS. 2A-2B are only two examples of the first stage converter 1. The first stage converter 1 may be implemented differently.

In connection with FIGS. 3A-3B, the serializer 3 will be discussed in detail.

Figure 3A:
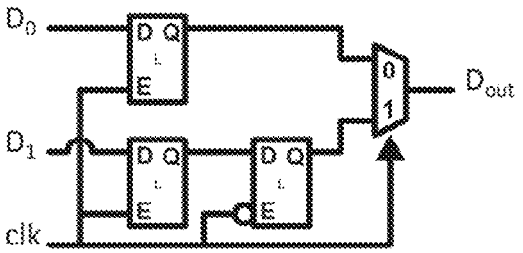
FIGS. 3A-3B are two examples of a serializer.

FIG. 3A is a schematical view of a basic 2:1 serializer for serializing two parallel data inputs into one serial data output.

In FIG. 3A, one latch is provided for the data input $D_0$, and two latches are provided for the data input $D_1$. A multiplexer is provided for selecting from the latched data of $D_0$ and $D_1$. The three latches and the multiplexer are controlled by a same clock signal clk.

Thus, by using latches and a multiplexer, the two parallel data inputs $D_0$ and $D_1$ can be serialized into one serial data output.

The 2:1 serializer of FIG. 3A can be used as a basic unit for building a serializer for serializing more than two parallel data inputs.

Figure 3B:
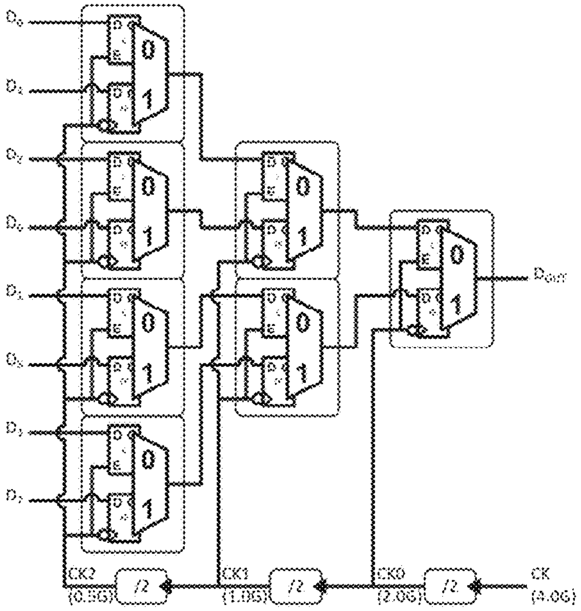

FIG. 3B is a schematical view of an 8:1 serializer for serializing eight parallel data inputs into one serial data output by using seven 2:1 serializers of FIG. 3A.

In a first level, four serializers are provided in parallel for respectively serializing two of the eight parallel data inputs $D_0$ to $D_7$. The first clock signal for driving these four serializers has a frequency CK2 (e.g., 0.5 GHz).

In a second level, two serializers are provided in parallel for respectively serializing four parallel data inputs (i.e. the outputs of the four serializers of the first level). The second clock signal for driving these two serializers has a frequency CK1 (e.g., 1 GHz), CK1=CK2×2.

In a third level, one serializer is provided for serializing two parallel data inputs (i.e. the outputs of the two serializers of the second level). The third clock signal for driving these two serializers has a frequency CK0 (e.g., 2 GHz), CK0=CK1×2.

The final output serial data stream has a frequency of CK, CK=CK0×2.

As shown in FIG. 3B, by cascading the 2:1 serializer of FIG. 3A, the 8:1 serializer of a higher serialization ratio can be achieved.

Further, the frequency of the final output serialized data steam of FIG. 3B (e.g., 4 GHz) is eight times of the frequency of the input parallel data $D_0$-$D_7$ (e.g., 0.5 GHz).

In connection with FIG. 4, operation principles of the serializer 3 will be discussed in detail.

Figure 4:
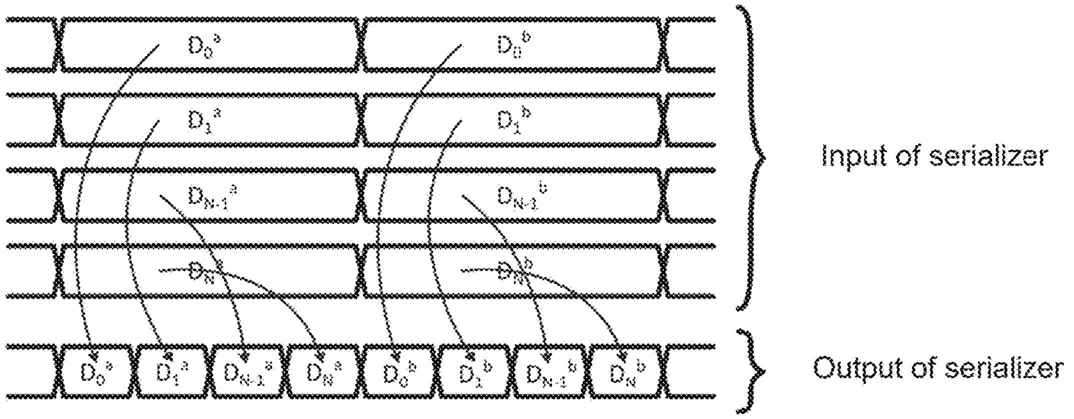
FIG. 4 illustrates operation principles of a serializer.

FIG. 4 illustrates the number N parallel data streams $D_0$, $D_1$, $D_{N-1}$, $D_N$, which are input to the 4:1 serializer (not shown). In this example, N=4.

The serializer 3 using a speed higher than the data speed of the number N parallel data streams $D_0$, $D_1$, $D_{N-1}$, $D_N$, to fetch data from each of the number N parallel data streams $D_0$, $D_1$, $D_{N-1}$, $D_N$, and combine the fetched into a serial data stream in a sequential order. Thus, by increasing the data speed (frequency), the number N parallel data streams $D_0$, $D_1$, $D_{N-1}$, $D_N$ can be combined into a serial data stream without losing any information.

In connection with FIG. 5, the second stage converter 2 will be discussed in detail.

Each slice of the at least some of the number K slices may be configured to generate the respective portion of the analog up-converted RF signal having a respective amplitude step.

The analog up-converted RF signal may be formed by combining the outputs of the at least some of the number K slices.

The analog up-converted RF signal may be formed by combining the outputs of the number K slices.

The amplitude step of the respective portion of the analog up-converted RF signal may be a maximum amplitude difference of said portion of the analog up-converted RF signal.

The amplitude step may be one least significant bit, LSB, step of the up-converted RF analog signal.

One slice of the second stage converter 2 of FIG. 5 comprises multiple analog delay elements connected in series. Thus, each of the analog delay elements may individually delay the input signal entering said analog delay element for a delay time. Further, each analog delay element is provided with an amplifier for increasing the amplitude of the input signal of said amplifier. All the delayed signals of a single slice may be summed together to form a portion of the analog up-converted RF signal. In other words, the analog delay elements and the amplifiers will work together to define the pulse shape (delay time and amplitude) of the portion of the analog up-converted RF signal for transmitting.

As shown in FIG. 5, the amplitude step of this slice may be refined into multiple tiny steps each having a duration of the delay time of the analog delay elements (assuming that the delay time is the same for each analog delay element).

Thus, the at least one analog delay element of the slice may provide an interpolation within the amplitude range of the amplitude step of said slice. In other words, instead of having number K of amplitude steps, the analog delay elements further refine the shape of the up-converted RF analog signal by interpolation.

Any two analog delay elements of each slice may be same or different.

Two same analog delay elements may have the same delay parameters such that they will cause the same delay time. In contrast, two different analog delay elements may have different delay parameters such that they will cause different delays in time.

Using different analog delay elements within one slice and/or between different slices may also improve spectral performance. Randomly changing a selected slice from slices with a different set of analog delay parameters for the analog delay elements may further improve the spectral performance and improve the performance in view of process, voltage and temperature variations.

Each analog delay element of the number K slices may have a respective weighting value for an amplitude scaling.

The weighting values for the analog delay elements of one slice may be e.g., 1, 2, 4, 8, 16 . . . . By providing a weighting value for each analog delay element, the RFDAC can be more flexible. This is also advantageous for shaping the analog signal.

The weighting value can be realized by the amplifier. The amplifier may comprise an inverter connected with a capacitor in series, as shown in FIG. 5.

The weighting values for any two analog delay elements of each slice may be the same or different.

Each slice of the number K slices may comprise a delay locked loop comprising the at least one analog delay element. The delay locked loop may be configured to synchronize said slice to a signal, e.g., the second clock signal.

The slice may be calibrated to synchronize with both the rising edge and the falling edge of said signal.

Any two slices of the number K slices may have a same number or different numbers of analog delay elements. For example, the number K slices may each comprise a same number L of analog delay element. For example, the number K slices may comprise different numbers of analog delay element each.

For example, any of the K slices that have a different number of analog delay cells and/or any of the K slices that have different analog delay elements are randomly selected during operation. Randomly changing a selected slice from slices with a different number of analog delay elements may further improve the spectral performance and improve the performance in view of process, voltage and temperature variations.

Each slice of the number K slices may comprise a delay locked loop comprising the at least one analog delay element. The delay locked loop may be configured to synchronize said slice to the second clock signal.

Each slice may be calibrated to synchronize with any of the rising edge and the falling edge of the second clock signal.

The slice may be implemented by a combination of a digital-to-analog converter (DAC) and a power amplifier (PA).

Each slice may comprise any of:

a switched-capacitor digital-to-analog converter, sc-DAC, a switched-capacitor amplifier, and a Zero Order Hold, ZOH, analog FIR filter.

In connection with FIGS. 6A-6B, different weighting schemes for the number K slices will be discussed in detail.

Each slice of the number K slices may have a respective weighting value for scaling a respective amplitude step of the respective portion of the analog up-converted RF signal.

In FIG. 6A, three different weighting schemes are provided as examples. For example, the N parallel data streams each comprises data of 3-bit, and K=7.

A first example is the LSB thermos weighted, e.g., 1, 1, 1, 1, 1, 1, 1.

A second example is the binary weighted, e.g., 1, 2, 4.

A third example is the LSB+MSB weighted (row-column), e.g., 1, 2, 2, 2.

From FIG. 6B, the second resolution remains unchanged no matter which weighting scheme is used.

By using the RFDAC for converting the digital baseband signal to the analog up-converted RF signal, the noises can be suppressed over the spectrum. Further, by using the number K slices comprising at least one analog delay element for shaping the respective portion of the analog up-converted RF signal, the spectral performance can be further improved. Moreover, the RFDAC can be easily calibrated and manufactured.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A radio frequency digital-to-analog converter, RFDAC, comprising:

a first stage converter, configured to receive a digital baseband signal and to generate a number N parallel data streams, each having a first resolution;

a serializer, configured to convert the number N parallel data streams into a serial data stream; and a second stage converter, configured to receive the serial data stream, and to generate an analog up-converted radio frequency, RF, signal based on the serial data stream, wherein the analog up-converted RF signal has a second resolution;

wherein the first stage converter is a digital Finite Impulse Response, FIR, filter;

wherein the first stage converter is configured to be driven by a first clock signal having a first frequency $F_{BB}$;

wherein the serializer is configured to be driven by a second clock signal having a second frequency $F_s$;

wherein the second stage converter comprises a number K slices in parallel, at least some of the number K slices are configured to each generate a respective portion of the analog up-converted RF signal based on a unique part of the serial data stream, such that the second resolution matches the first resolution;

wherein each slice of the number K slices comprises at least one analog delay element for shaping the respective portion of the analog up-converted RF signal;

wherein $F_{BB}=F_s/N$;

wherein N is an integer, and N>=1; and wherein K is an integer, and K>=2, preferably K>=4.

2. The RFDAC according to claim 1, wherein N>=2.

3. The RFDAC according to claim 1, wherein the first stage converter comprises a number N modules in parallel, each configured to generate a respective one of the number N parallel data streams.

4. The RFDAC according to claim 1, wherein the number N parallel data streams comprise data encoded by binary or thermometric coding.

5. The RFDAC according to claim 1, wherein the second resolution is equal to or different from the first resolution.

6. The RFDAC according to claim 1, wherein each slice of the number K slices has a respective weighting value for scaling a respective amplitude step of the respective portion of the analog up-converted RF signal.

7. The RFDAC according to claim 1, wherein each slice of the at least some of the number K slices is configured to generate the respective portion of the analog up-converted RF signal having a respective amplitude step; and wherein the analog up-converted RF signal is formed by combining the outputs of the at least some of the number K slices.

8. The RFDAC according to claim 1, wherein the at least one analog delay element is tunable or programmable.

9. The RFDAC according to claim 1, wherein any two slices of the number K slices have a same number or different numbers of analog delay elements and wherein any two analog delay elements of each slice are same or different.

10. The RFDAC according to claim 9, wherein any of the K slices that have a different number of analog delay cells and/or any of the K slices that have different analog delay elements are randomly selected during operation.

11. The RFDAC according to claim 1, wherein each analog delay element of the number K slices has a respective weighting value for an amplitude scaling.

12. The RFDAC according to claim 1, wherein each slice of the number K slices comprises a delay locked loop comprising the at least one analog delay element; and wherein the delay locked loop is configured to synchronize said slice to the second clock signal.

13. The RFDAC according to claim 1, wherein each slice comprises any of:

a switched-capacitor digital-to-analog converter, sc-DAC, a switched-capacitor amplifier, and a Zero Order Hold, ZOH, analog FIR filter.

14. A radio frequency transmitter, comprising an RFDAC according to claim 1, configured to receive the digital baseband signal and to generate the analog up-converted RF signal for transmitting.

15. A digital-to-analog converting method, comprising:

receiving a digital baseband signal and generating a number N parallel data streams each having a first resolution, by a first stage converter;

converting the number N parallel data streams into a serial data stream, by a serializer; and receiving the serial data stream, and generating an analog up-converted RF signal based on the serial data stream, by a second stage converter, wherein the analog up-converted RF signal has a second resolution;

wherein the first stage converter is a digital Finite Impulse Response, FIR, filter;

wherein the first stage converter is configured to be driven by a first clock signal having a first frequency $F_{BB}$;

wherein the serializer is configured to be driven by a second clock signal having a second frequency $F_s$;

wherein the second stage converter comprises a number K slices in parallel, the method comprising:

at least some of the number K slices each generating a respective portion of the analog up-converted RF signal based on a unique part of the serial data stream, such that the second resolution matches the first resolution;

wherein each slice of the number K slices comprises at least one analog delay element, the method comprising:

the at least one analog delay element shaping the respective portion of the analog up-converted RF signal;

wherein $F_{BB}=F_s/N$;

wherein N is an integer, and N>=1; and wherein K is an integer, and K>=2, preferably K>=4.

* * * * *